(12) United States Patent
Hilliger et al.

(10) Patent No.: US 7,084,027 B2
(45) Date of Patent: Aug. 1, 2006

(54) METHOD FOR PRODUCING AN INTEGRATED CIRCUIT

(75) Inventors: Andreas Hilliger, Dresden (DE); Ralf Staub, Dresden (DE); Eike Lüken, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 71 days.

(21) Appl. No.: 10/399,985

(22) PCT Filed: Sep. 18, 2001

(86) PCT No.: PCT/EP01/10783

§ 371 (c)(1),
(2), (4) Date: Apr. 23, 2003

(87) PCT Pub. No.: WO02/39488

PCT Pub. Date: May 16, 2002

(65) Prior Publication Data

US 2004/0014310 A1 Jan. 22, 2004

(30) Foreign Application Priority Data

Nov. 8, 2000 (DE) .............................. 100 55 290

(51) Int. Cl.
  *H01L 21/8242* (2006.01)
(52) U.S. Cl. .............. 438/239; 438/243; 438/244; 438/250; 438/256; 438/386; 438/387; 438/396; 438/399
(58) Field of Classification Search ............. 438/239, 438/243–244, 250, 256, 386–387, 396, 399
See application file for complete search history.

(56) References Cited

U.S. PATENT DOCUMENTS 5,792,687 A * 8/1998 Jeng et al. ............... 438/253
5,864,156 A   1/1999 Juengling
5,930,668 A   7/1999 Gardner
6,037,211 A * 3/2000 Jeng et al. ............... 438/253
6,114,253 A   9/2000 Jang (Continued)

FOREIGN PATENT DOCUMENTS

KR   102000065823   11/2000

(Continued)

OTHER PUBLICATIONS

Korean Office Action dated Mar. 14, 2005.

(Continued)

*Primary Examiner*—Lynne A. Gurley
(74) *Attorney, Agent, or Firm*—Jenkins, Wilson, Taylor & Hunt, P.A.

(57) ABSTRACT

The invention relates to a method for producing an integrated circuit comprising the following steps: preparing a semi-conductor substrate (1) with a contacting circuit area (SS); providing an insulating layer (IS) on the surface of the semi-conductor substrate (1): providing a contact hole (KL) in the insulating layer (IS) for making contacting the circuit area (SS); providing an insulating spacer area (10') in at least the area above the contact hole (KL); providing at least three trenches (BG1; BG2; BG3), the first (BG1) of which is arranged next to the contact hole (KL), a second (BG2) is disposed across the contact hole (KL) and a third (BG3) is next to the contact hole (KL). The spacer area (10') is placed between the first and the second trench (BG1; BG2) and the second and the third trench (BG2; BG3); filling the trenches (BG1; BG2; BG3) with a conductive material; and chemical-mechanical polishing of conductive material for producing three separated trenches (BL1; BL2; BL3).

11 Claims, 4 Drawing Sheets

U.S. PATENT DOCUMENTS

| | | | |
|---|---|---|---|
| 6,153,513 A * | 11/2000 | Lee et al. | 438/639 |
| 6,258,663 B1 * | 7/2001 | Koh et al. | 438/254 |
| 2003/0127677 A1 * | 7/2003 | Park et al. | 257/300 |
| 2003/0139034 A1 * | 7/2003 | Yuang | 438/634 |
| 2003/0235948 A1 * | 12/2003 | Park | 438/253 |
| 2004/0029324 A1 * | 2/2004 | Park | 438/142 |
| 2004/0164328 A1 * | 8/2004 | Lee et al. | 257/213 |

FOREIGN PATENT DOCUMENTS

| | | |
|---|---|---|
| WO | WO 97/06556 | 2/1997 |
| WO | WO 97/10612 | 3/1997 |

OTHER PUBLICATIONS

"Fabricating One Semiconductor Contact Stud Borderless to Another," *IBM Technical Disclosure Bulletin*, vol. 34, No. 4B, Sep. 1991, pp. 277-279.

German Office Action dated Jun. 8, 2001.

International Search Report dated May 2, 2002.

* cited by examiner

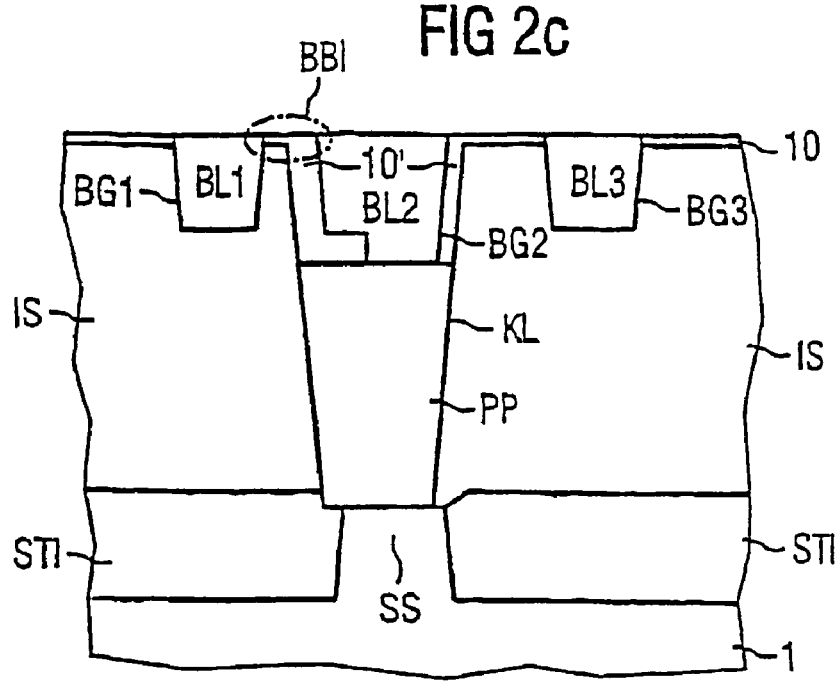
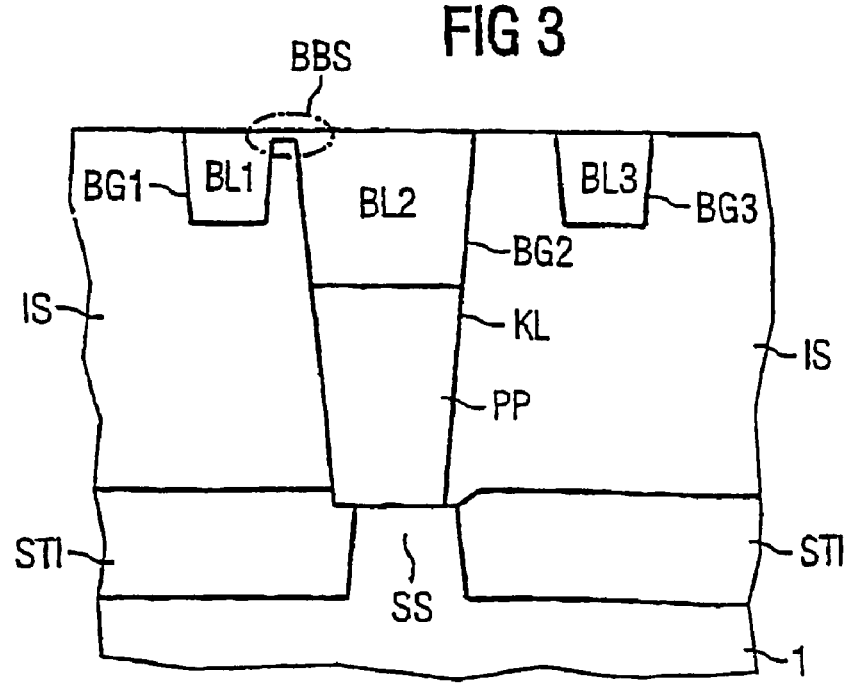
(PRIOR ART)

US 7,084,027 B2

METHOD FOR PRODUCING AN INTEGRATED CIRCUIT

TECHNICAL FIELD

The present invention relates to a method for fabricating an integrated circuit.

BACKGROUND ART

U.S. Pat. No. 5,864,156 discloses lining the upper region of the sidewalls of contact holes with a spacer material.

U.S. Pat. No. 5,792,687 discloses a method for forming contact holes, spacers being formed on the sidewalls of contact holes on an interlevel dielectric.

IBM Technical Disclosure Bulletin, Vol. 34, No. 4B, Sep. 1, 1991, pages 277 to 279, discloses the fabrication of contact plugs which are placed beside one another with the interposition of a spacer.

Although applicable to arbitrary integrated circuits, in principle, the present invention and the problem area on which it is based are explained with regard to integrated DRAM circuits using silicon technology.

The general problem area on which the present invention is based is that, during the fabrication of a common self-aligned bit line contact of a DRAM memory cell pair, the widening of the contact hole or its lateral offset leads to a risk of short circuits with respect to adjacent bit lines, which risk grows as design rules become smaller. What is increasingly problematic is the rising aspect ratio of the bit line contact owing to the decreasing horizontal and increasing vertical dimensions, i.e. the height of the gate stack.

FIG. 3 shows a diagrammatic illustration of a known integrated DRAM circuit using silicon technology.

In FIG. 3, 1 designates a silicon semiconductor substrate in which an active region or circuit region SS is provided in a manner surrounded by isolation trenches STI.

An insulation layer IS, for example made of BPSG or $SiO_2$, is situated above the circuit region SS and the isolation trenches STI. A contact hole KL is introduced into the insulation layer IS, said contact hole containing a contact which has a polysilicon contact plug PP in the lower region and a bit line BL2 in the upper region. Situated adjacent to the bit line BL2 are further bit lines BL1 and BL3 in corresponding bit line trenches BG1 and BG3, respectively.

What is problematic in the case of this arrangement is the fact that the contact hole KL may have a certain offset with respect to the circuit region SS and with respect to the adjacent bit lines, a displacement toward the left-hand side of FIG. 3 in the present example. The bit lines BL1, BL2, BL3 are fabricated in such a way that a metal layer made of tungsten is deposited above the bit line trenches and above the substrate surface, which metal layer is polished back in a subsequent process step by means of a chemical mechanical polishing process. By virtue of the offset of the contact hole KL toward the left, a short circuit between the bit lines BL1 and BL2 can occur at the location designated by BBS, which disturbs the function of said bit lines.

In this case, the bit line contact hole plane, which is relatively non critical lithographically in terms of the design, is fabricated with minimal contact hole dimensions in order to alleviate the problem of short-circuiting with respect to the adjacent bit line fabricated in a separate lithography. The overlay requirements are very high in this case. This complicates the lithography and the contact hole etching and makes them more expensive without fundamentally solving the problem. Moreover, there is an increase in the risk of inadequately opened bit line contacts at the contact base. The requirements made of the alignment of the bit line contact with respect to the active region or circuit region SS are increased. This results in a general contradiction which becomes more and more problematic with further shrinks.

SUMMARY OF THE INVENTION

Therefore, it is an object of the present invention to provide a method for fabricating an integrated circuit of this type, the risk of line short circuits of adjacent lines being reduced.

According to the invention, this object is achieved by means of the fabrication method specified in claim 1.

The idea on which the present invention is based consists in applying an insulating suitable layer to the sidewalls in the upper region of the contact hole, which layer prevents short circuits with respect to adjacent bit lines.

The fabrication method according to the invention has the advantage, inter alia, over the known solution approach, through the addition of a few technologically noncritical processes, the actual contact-connection of the silicon is decoupled from the contact-connection of the passing bit line. Thus, it is then possible to relax the fabrication of the contact hole mask with regard to dimension and overlay, to separately optimize the contact hole etching and nevertheless to avoid short circuits between the bit lines.

Advantageous developments and improvements of the fabrication method specified in claim 1 are found in the subclaims.

In accordance with one preferred development, a contact plug made of a conductive material is provided in the lower region of the contact hole.

In accordance with a further preferred development, the spacer region is fabricated by the deposition and anisotropic etching-back of an insulating spacer layer, as a result of which the spacer layer is left only on the sidewalls of the contact hole.

In accordance with a further preferred development, after the provision of the spacer region, an antireflection coating is deposited on the entire structure, which essentially fills the contact hole.

In accordance with a further preferred development, a mask for the line trenches is applied on the antireflection coating; the first and third line trenches are etched into the insulation layer after the removal of the overlying antireflection coating using the mask; and the second line trench is formed using the mask and after the removal of the antireflection coating from the upper region of the contact hole.

In accordance with a further preferred development, an insulating spacer layer is deposited above the structure and a mask for the line trenches is applied on the insulating spacer layer; the first, second and third line trenches are etched into the insulation layer after the removal of the overlying insulation spacer layer using the mask, at the same time the insulating spacer layer being removed at least partly from the contact hole during the formation of the second line trench.

In accordance with a further preferred development, the line trenches have a distance and a width corresponding to the minimum structure width.

In accordance with a further preferred development, the circuit region is surrounded by STI trenches.

In accordance with a further preferred development, the line material is tungsten.

In accordance with a further preferred development, the upper region of the spacer region is removed during the chemical mechanical polishing.

In accordance with a further preferred development, the spacer regions are fabricated from CVD silicon dioxide.

In accordance with a further preferred development, the lines are bit lines of an integrated memory circuit.

Exemplary embodiments of the invention are illustrated in the drawings and explained in more detail in the description below.

BRIEF DESCRIPTION OF THE DRAWINGS

In the figures:

FIGS. 2a–c show diagrammatic illustrations of different process steps of a fabrication method for an integrated DRAM circuit using silicon technology as second embodiment of the present invention; and FIG. 3 shows a diagrammatic illustration of a known integrated DRAM circuit using silicon technology.

DETAILED DESCRIPTION OF THE INVENTION

In the figures, identical reference symbols designate identical or functionally identical component parts.

FIGS. 1a–d show diagrammatic illustrations of different process steps of a fabrication method for an integrated DRAM circuit using silicon technology as first embodiment of the present invention.

In accordance with FIG. 1a, as in the case of the known, customary process sequence explained with reference to FIG. 3, firstly a contact hole KL is provided in the insulation layer IS, which contact hole meets the circuit region SS with a certain offset.

The polysilicon contact plug PP is then provided by polysilicon being deposited over the whole area and subsequently being etched back to a predetermined depth.

Figure 1A:
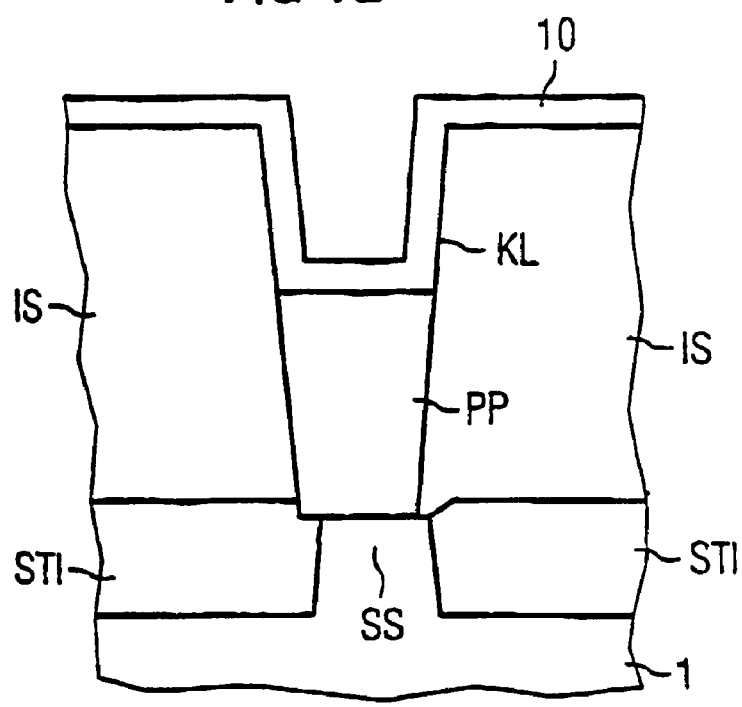
FIGS. 1a–d show diagrammatic illustrations of different process steps of a fabrication method for an integrated DRAM circuit using silicon technology as first embodiment of the present invention.

In a subsequent process step, a CVD-SiO$_2$ layer having a thickness of approximately 20 nm to 70 nm is deposited, which layer is designated by 10 in FIG. 1a.

Figure 1B:
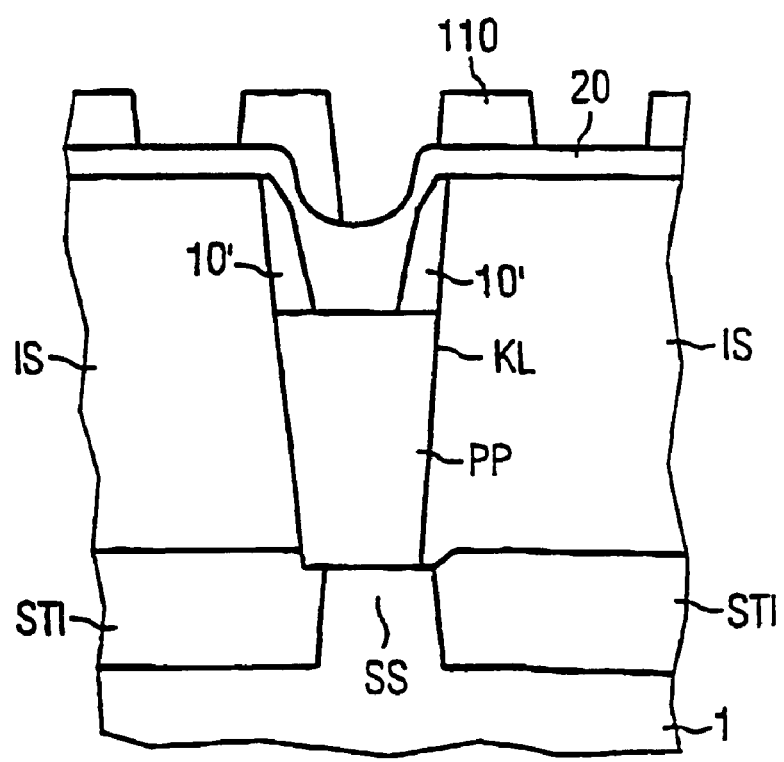

In a subsequent process step, the SiO$_2$ is etched anisotropically by means of a separate etching process in order to form from the spacer layer 10 spacer regions 10' on the sidewalls of the upper region of the contact hole KL on the polysilicon contact plug PP, as illustrated in FIG. 1b. In particular, the spacer layer 10 is in this case removed at the lower contact area with respect to the polysilicon contact plug PP, whereas the upper sidewalls of the contact hole KL remain covered with the SiO$_2$.

In a subsequent process step, an antireflection coating 20 is applied over the entire structure, which essentially fills the contact hole KL, as illustrated in FIG. 1b. A photoresist mask 110, which defines the position of the later bit lines BL1, BL2, BL3, is formed above the resulting structure.

Figure 1C:
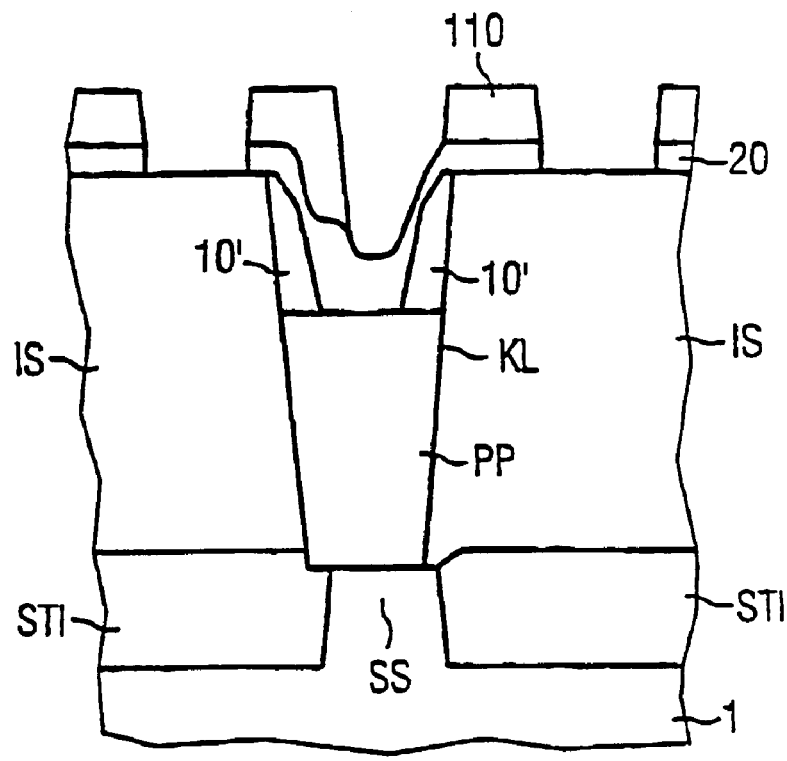

As illustrated in FIG. 1c, the antireflection coating 20 is then removed above the insulation layer IS and to a certain extent in the contact hole KL. In a subsequent process step, the insulation layer IS is etched selectively by means of the mask 110 in order to form the bit line trenches BG1, BG3 to the left and right, respectively, of the contact hole KL. Afterward, the mask 110 and the antireflection coating 20 are removed in corresponding etching processes or stripping processes. Three bit line trenches BL1, BL2, BL3 are thus obtained, one of the bit line trenches BL2 lying between the spacer regions 10' and the other bit line regions BL1, BL3 being accommodated adjacent in the insulation layer IS.

In a subsequent process step, tungsten is deposited over the whole area of the resulting structure and then removed by a chemical mechanical polishing step in such a way that separate bit lines BL1, BL2, BL3 are formed.

Figure 1D:
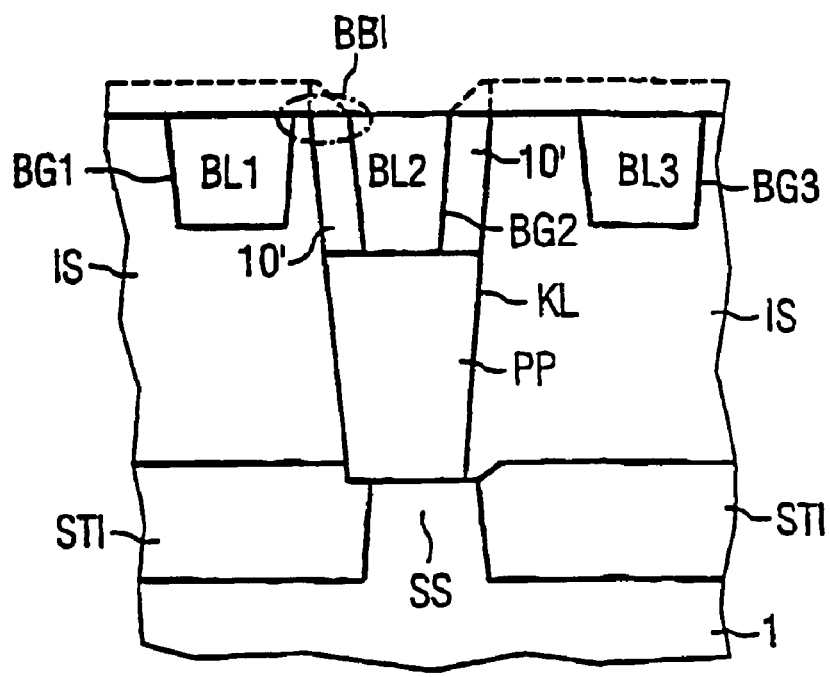

FIG. 1d illustrates that, during the chemical mechanical polishing step, the surface of the insulation layer IS is also partly removed (dashed line in FIG. 1). This removal of the surface of the insulation layer IS and also the removal of the upper region of the spacer regions 10' mean that, on both sides of the central bit line BL2, the entire thickness of the spacer region 10' on the sidewall of the contact hole takes effect for improving the lateral insulation, as can clearly be discerned from FIG. 1d. Consequently, a short-circuit region BBS (cf. in FIG. 3) is avoided and the bit line BL2 is sufficiently insulated from the adjacent bit lines BL1, BL3 by the superficial spacer regions 10', the superficial insulation region being designated by BBI in FIG. 1d.

Figure 2A:
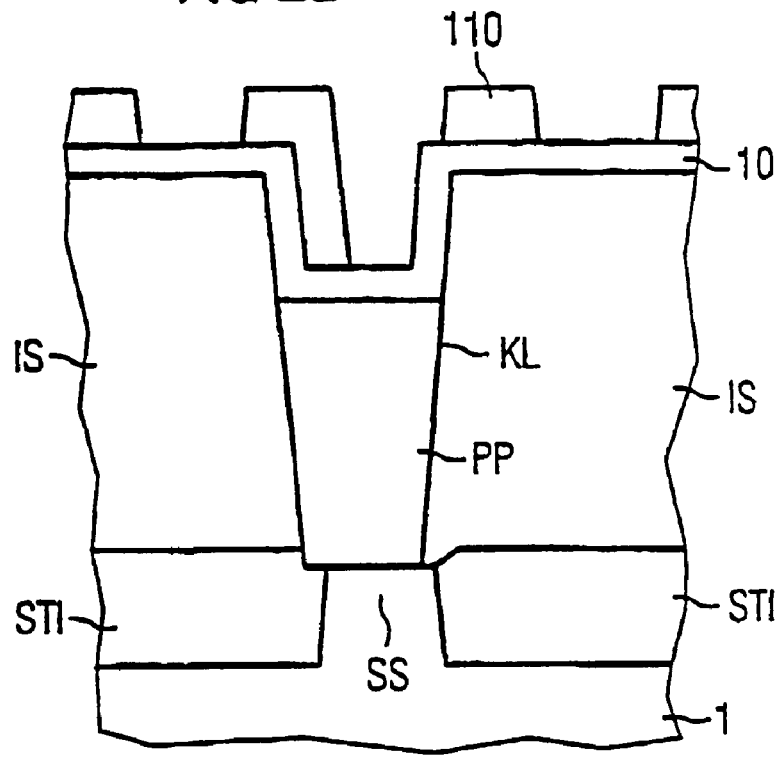
Figure 2B:
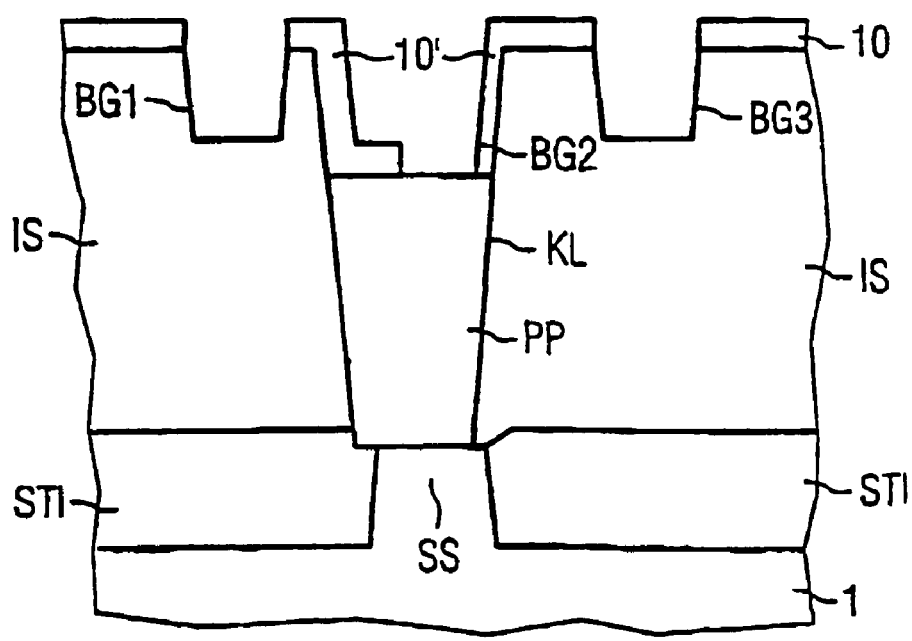

FIGS. 2a–c show diagrammatic illustrations of different process steps of a fabrication method for an integrated DRAM circuit using silicon technology as second embodiment of the present invention.

The second embodiment, described with reference to FIGS. 2a–c, differs from the first embodiment in that no antireflection coating 20 (compare with is FIG. 1b) is used.

The starting point of the second embodiment corresponds to the state illustrated in FIG. 1a. Afterward, the photoresist mask 110 is applied directly on the CVD-SiO$_2$ spacer layer 10, as illustrated in FIG. 2a. The thickness of said CVD-SiO$_2$ spacer layer 10 is approximately 20 nm to 70 nm, analogously to the first embodiment.

In a subsequent etching step, by means of the mask 110, firstly the spacer layer 10 and then the underlying insulation layer IS are etched in a corresponding anisotropic etching process, the polysilicon contact plug PP acting as an etching stop within the contact hole KL. This leads to the process stage shown in FIG. 2b. In this respect, it should be mentioned that, as shown in FIG. 2a, an offset of the mask 110 occurs but is noncritical since the left-hand sidewall of the contact hole KL, which lies in a critical position with respect to the later bit line BL1, remains covered with SiO$_2$ since the region is protected by the resist of the mask 110.

Removal of the mask 110 yields a structure in accordance with FIG. 2b, spacer regions 10' being situated in the upper region of the contact hole KL, of which the left-hand spacer region is significantly thicker than the right-hand spacer region. In a subsequent process step, analogously to the first embodiment, tungsten is deposited over the whole area of the resulting structure and the tungsten is subsequently polished back by chemical mechanical polishing in order to obtain the structure shown in FIG. 2c, in which separate bit lines BL1, BL2, BL3 are present in the corresponding bit line trenches BG1, BG2, BG3.

In this case, too, the region designated by BBI is noncritical because the bit line BL2 is isolated from the bit line BL1 by a wide spacer region BBI and the short-circuit risk is thus minimized.

Although the present invention has been described above using preferred exemplary embodiments, it is not restricted thereto, but rather can be modified in diverse ways.

In particular, the selection of the layer materials and the concrete circuit are only by way of example and can be varied in many different ways.

The invention claimed is:

1. A method for fabricating an integrated circuit, the method comprising:
   (a) providing an insulation layer on the surface of a semiconductor substrate with a circuit region to be contact-connected;
   (b) providing a contact hole in the insulation layer for the purpose of contact-connecting the circuit region, the contact hole having an upper region and a lower region;
   (c) providing a contact plug made of a conductive material in the lower region of the contact hole;
   (d) providing an insulating spacer region on the sidewalls in the upper region of the contact hole;
   (e) providing at least three line trenches, of which a first line trench on the one hand runs adjacent to and spaced apart from the contact hole in the insulation layer, a second line trench runs through the contact hole and a third line trench on the other hand runs adjacent to and spaced apart from the contact hole in the insulation layer, the spacer region being left on the sidewalls of the contact hole between the first and the second line trench and the second and the third line trench;
   (f) filling of the three line trenches with a line material;
   (g) chemical mechanical polishing of the line material for the purpose of producing three separate lines; and
   (h) after providing the spacer region, depositing an antireflection coating on the entire structure, which essentially fills the contact hole.

2. The method as claimed in claim 1, wherein the spacer region is fabricated by the deposition and anisotropic etching-back of an insulating spacer layer, as a result of which the spacer layer is left only on the sidewalls of the contact hole.

3. The method as claimed in claim 1, wherein a mask for the line trenches is applied on the antireflection coating; the first and third line trenches are etched into the insulation layer after the removal of the overlying antireflection coating using the mask; and the second line trench is formed using the mask and after the removal of the antireflection coating from the upper region of the contact hole.

4. The method as claimed in claim 1, wherein an insulating spacer layer is deposited on the insulation layer or the contact hole and a mask for the line trenches is applied on the insulating spacer layer; the first, second and third line trenches are etched into the insulation layer after the removal of the overlying insulation spacer layer using the mask, at the same time the insulating spacer layer being removed at least partly from the contact hole during the formation of the second line trench.

5. The method as claimed in claim 1, wherein the line trenches have a distance and a width corresponding to the minimum structure width.

6. The method as claimed in claim 1, wherein the circuit region is surrounded by STI trenches.

7. The method as claimed in claim 1, wherein the line material is tungsten.

8. The method as claimed in claim 1, wherein the upper region of the spacer region is removed during the chemical mechanical polishing.

9. The method as claimed in claim 1, wherein the spacer regions are fabricated from CVD silicon dioxide.

10. The method as claimed in claim 1, wherein the lines are bit lines of an integrated memory circuit.

11. A method for fabricating an integrated circuit having the following steps:
   (a) providing an insulation layer on the surface of a semiconductor substrate with a circuit region to be contact-connected;
   (b) providing a contact hole in the insulation layer for the purpose of contact-connecting the circuit region, the contact hole having an upper region and a lower region;
   (c) providing a contact plug made of a conductive material in the lower region of the contact hole;
   (d) providing an insulating spacer region on the sidewalls at in the upper region of the contact hole;
   (e) providing at least three line trenches, of which a first line trench on the one hand runs adjacent to and spaced apart from the contact hole in the insulation layer, a second line trench runs through the contact hole and a third line trench on the other hand runs adjacent to and spaced apart from the contact hole in the insulation layer, the spacer region being left on the sidewalls of the contact hole between the first and the second line trench and the second and the third line trench;
   (f) filling of the three line trenches with a line material; and
   (g) chemical mechanical polishing of the line material for the purpose of producing three separate lines,
   wherein an insulating spacer layer is deposited on the insulation layer or the contact hole and a mask for the line trenches is applied on the insulating spacer layer; the first, second and third line trenches are etched into the insulation layer after the removal of the overlying insulation spacer layer using the mask, at the same time the insulating spacer layer being removed at least partly from the contact hole during the formation of the second line trench.

* * * * *